(12) United States Patent
Su et al.

(10) Patent No.: US 9,368,487 B1
(45) Date of Patent: Jun. 14, 2016

(54) SEMICONDUCTOR DEVICE WITH DYNAMIC LOW VOLTAGE TRIGGERING MECHANISM

(71) Applicant: Taiwan Semiconductor Manufacturing Company Limited, Hsinchu (TW)

(72) Inventors: Yu-Ti Su, Tainan (TW); Li-Wei Chu, Hsinchu (TW); Ming-Fu Tsai, Hsinchu (TW); Jen-Chou Tseng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/607,155

(22) Filed: Jan. 28, 2015

(51) Int. Cl.
| | |
|---|---|
| H01L 23/62 | (2006.01) |
| H01L 27/02 | (2006.01) |
| H01L 29/10 | (2006.01) |
| H01L 29/06 | (2006.01) |
| H01L 49/02 | (2006.01) |
| H01L 23/50 | (2006.01) |
| H01L 21/8234 | (2006.01) |

(52) U.S. Cl.
CPC .... *H01L 27/0266* (2013.01); *H01L 21/823493* (2013.01); *H01L 23/50* (2013.01); *H01L 27/0248* (2013.01); *H01L 27/0288* (2013.01); *H01L 28/20* (2013.01); *H01L 29/0642* (2013.01); *H01L 29/0688* (2013.01); *H01L 29/1079* (2013.01); *H01L 29/1095* (2013.01)

(58) Field of Classification Search
CPC .................................................. H01L 27/0248
USPC ......................................................... 257/355
See application file for complete search history.

(56) References Cited

U.S. PATENT DOCUMENTS

| | | | |
|---|---|---|---|
| 8,519,434 B2 * | 8/2013 | Chen .................... | H01L 27/0259 257/173 |
| 2008/0074908 A1 * | 3/2008 | Chang .................... | H01L 29/808 363/49 |
| 2010/0193869 A1 * | 8/2010 | Habasaki ............ | H01L 27/0266 257/360 |

* cited by examiner

*Primary Examiner* — David Vu
*Assistant Examiner* — Brandon Fox
(74) *Attorney, Agent, or Firm* — Jones Day

(57) ABSTRACT

An electrostatic discharge (ESD) protection device is disclosed, which includes a substrate of a positive dopant type; a p-well defined in the substrate; a depletion inducing structure of a negative dopant type having a gap defined in a bottom portion thereof disposed in the p-well, and a n-channel device disposed in a planar encircled region defined by the depletion inducing structure. The well region is in connection with the substrate through the depletion inducing structure. Upon an ESD stress, the depletion inducing structure induces an expanded depletion region in the substrate under the well region, thus providing a substrate trigger mechanism that reduces the triggering voltage of the ESD protection device.

25 Claims, 10 Drawing Sheets

Providing a substrate of a first dopant type that includes a well region of the first dopant type providing a device in the well region, the device includes a diffusion region providing a laterally enclosing structure in the well region around a periphery of the device providing a bottom enclosing structure under the enclosing substrate having a gap defines therein providing an isolation structure in the well region laterally enclosing the device providing a native nMOS blocked implant (NTN) region in the well region above the gap

Fig. 10

SEMICONDUCTOR DEVICE WITH DYNAMIC LOW VOLTAGE TRIGGERING MECHANISM

TECHNICAL FIELD

The present invention relates generally to semiconductor devices, and, more particularly, to electrostatic discharge (ESD) protection devices having a dynamic low voltage triggering mechanism.

BACKGROUND

Electrostatic protection is an important issue for the protection of integrated circuits. Since an electrostatic charge is has a relatively high voltage (maybe thousands of volts), electrostatic discharge (ESD) protection circuits are required to protect semiconductor device from being damaged by the electrostatic charge.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a chart that depicts a method of providing ESD protection for a device in accordance with the instant disclosure.

DETAILED DESCRIPTION

Figure 1:
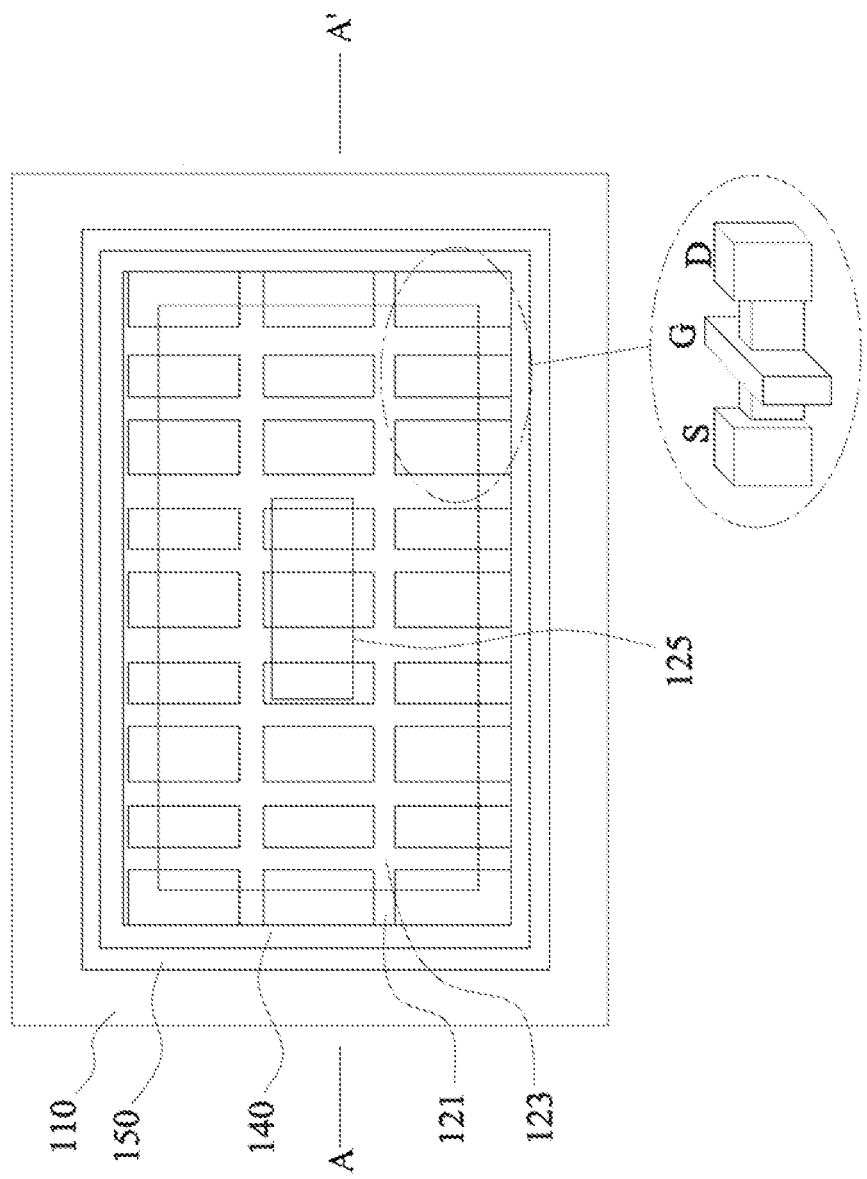
FIG. 1 shows an overhead layout diagram of a semiconductor structure in accordance with embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the handling of semiconductor chip packages, electrostatic discharge (ESD) may result in damage to the semiconductor devices on the chip. On-chip protection circuits are used to provide a safe discharge path. The protection circuit is basically a switch which is off during normal circuit operation and turns on during an ESD event when a high voltage is present at a pin of the chip.

Metal oxide semiconductor (MOS) devices, such as the ground-gate n-type MOS devices (GGnMOS) in multi-finger configuration, have been widely used as an electrostatic discharge (ESD) protection device. However, conventional MOS type ESD protection devices tend to exhibit slow turn-on speed and require high trigger voltage, which practically reduce the overall responsiveness and operating efficiency during the occurrence of an ESD strike. Such issues adversely limit the reliability of this protective mechanism.

Figure 2:
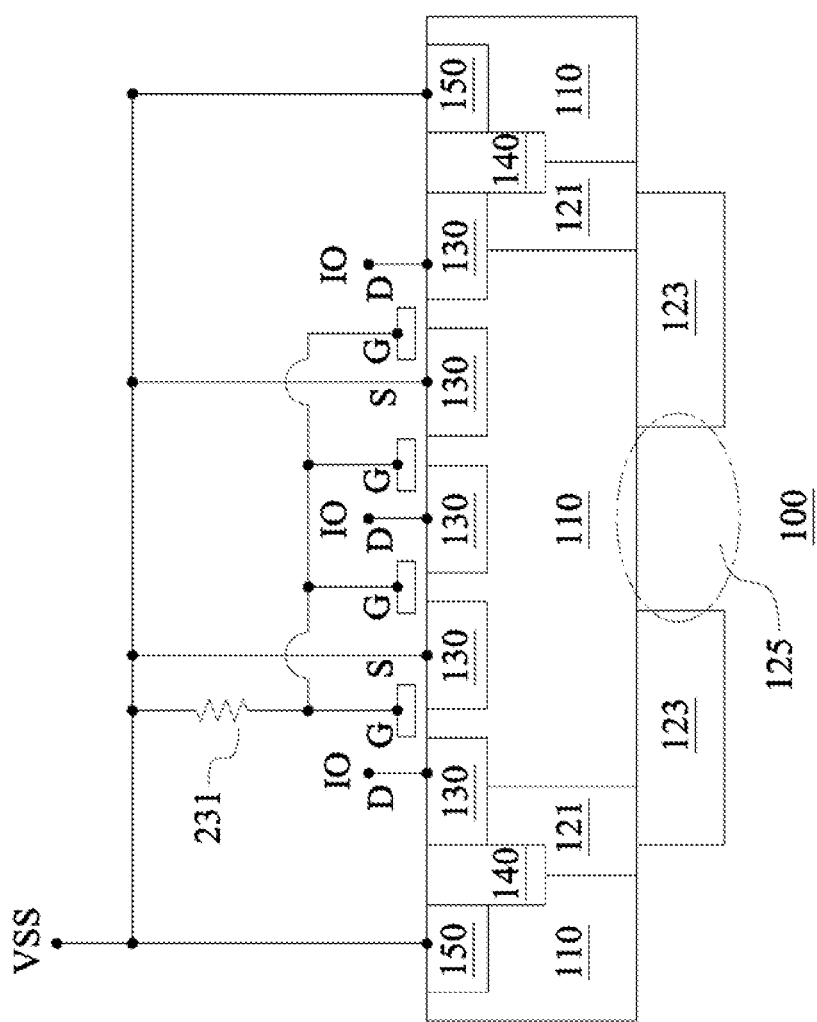
FIG. 2 is a schematic illustration showing a lateral cross-sectional view of a semiconductor structure in accordance with embodiments of the instant disclosure.

Referring concurrently to FIGS. 1 and 2. FIG. 1 shows an overhead layout diagram of a semiconductor structure in accordance with some embodiments of the instant disclosure. FIG. 2 is a schematic illustration showing a lateral cross-sectional view of the semiconductor structure in accordance with embodiments of the instant disclosure, taken along the line A-A' of FIG. 1. FIGS. 1 and 2 cooperatively provide a comprehensive illustration of the structural arrangement of a semiconductor device in accordance with the instant disclosure. Moreover, in order to ensure a better illustration of the structural arrangement, the illustration of FIG. 1 employs a partial see-through view, particularly at the central region thereof, to show certain under surface features that otherwise would be hidden from a conventional planar view (e.g., feature such as N-well 121 and deep N-well 123 at the central region).

Specifically, the semiconductor structure in accordance with the instant embodiment comprises a substrate of a first dopant type. In the instant example, a substrate of positive dopant type (e.g., a P_sub 100) is utilized. A well region of the same first dopant type (e.g., a p-well/PW 110) is provided in the substrate 100 at the top/exposed portion thereof. The well region 110 may be a positively doped region in the substrate that substantially defines a predetermined depth from the top surface thereof.

The well region 110 comprises at least one diffusion region of a second dopant type (e.g., a N+ diffusion region 130)

arranged at the surface region thereof, which may define the active regions (such as source and drain nodes) of one or more active device. In the instant example, three rows of five diffusion regions (i.e., a 3×5 diffusion region array) are exposedly arranged in the well region 110, distributed at a central region of the well region 110.

As better illustrated in the lateral cross-sectional view of FIG. 2, the five diffusion regions 130 in a row respectively define a series of alternatively arranged drain (D) and source (S) regions that constitute the "fingers" of a multi-finger n-type metal oxide semiconductor (GGnMOS) device. Starting from the left hand side of FIG. 2, the diffusion region 130 arranged at the left-most periphery of the row is connected to an I/O pad (IO) (which is often the point of origin of an ESD strike), and defines a drain region (D) of the multi-finger nMOS device. The diffusion region 130 arranged immediately adjacent to the drain region (D) is connected to the ground (VSS) and defines a source region (S) of the multi-finger nMOS device. The alternating arrangement of source and drain regions extends across the row of the diffusion regions 130 and ends with a diffusion region of the right-most periphery defining a drain region (D) of the multi-finger device, which is connected to an I/O pad (10).

The profile dimension of each of the diffusion regions need not be identical. Particularly, for ESD protection purposes, the drain regions (D) often comprises a wider/larger profile than the source regions (S). The instant figures are mainly for illustration purposes and may not be drawn to exact practical scale. The positively doped regions of the well region 110 between the each pair of adjacent drain (D) and source (S) regions respectively define the channel regions of the multi-finger nMOS device. Accordingly, a gate structure (G) is respectively arranged over the channel region of the multi-finger nMOS device. Similar to the source regions (S), the gate structures (G) are also connected to the ground (VSS), forming a grounded-gate nMOS (GGnMOS) that functions as an ESD protection device. In addition, a gate resistor 231 may be connected between the gate structures (G) and the ground (VSS). The addition of the gate resistor 231 helps to couple a fraction of the ESD charge to the gate (G) of the nMOS upon an ESD event, thereby lowering a trigger voltage of the ESD protection device (thus making it more responsive to an ESD strike), which in turn increases the efficiency/performance of the protection device. The resistance value of the gate resistor 231 should be chosen to ensure that the ESD protection circuit is only activated in ESD stress conditions.

The multi-finger nMOS device in the instant example may utilize a horizontal device architecture, which may include a horizontal planar channel layout, a horizontal fin channel layout, or a horizontal gate all around layout.

The semiconductor structure further comprises a depletion inducing structure of a second dopant type (e.g., different from the first dopant type of the substrate and the well region) downwardly extending from the well region 110 to the substrate 100 and substantially dividing the well region 110 into an enclosed portion (EN) and an exterior portion (EX). Specifically, the depletion inducing structure comprises a laterally enclosing portion (e.g., as defined by a n-well/NW 121) and a bottom enclosure portion (e.g., as defined by a deep n-well/DNW 123) arranged there-below and in connection there-with. In some embodiments, the laterally enclosing portion may be realized by an horizontally encircling n-well 121 arranged in the well region 110, while the bottom enclosure portion may be realized by a deep n-well 123 arranged in the substrate 100.

While the instant example employs a positive type dopant as the first dopant type and a negative type dopant as the second dopant type, the choice of arrangement may be altered in other embodiments to suit the specific operational requirements of certain applications.

Analogously, the depletion inducing structure of the instant example substantially resembles a flowerpot with an encircling side wall defined by the laterally enclosing portion (e.g., NW 121) connected to a disk-like bottom wall defined by the bottom enclosing portion (e.g., DNW 123) with a "drain hole" arranged therein (e.g., the gap 125 in the DNW that allows communication between the PW and the P_sub). In the instant example, the n-well 121 is shown to be a rectangular encircling structure disposed in the well region 110 with at least a portion thereof being arranged under the plurality of diffusion regions 130 (as shown in the cross-section along line A-A').

Specifically, from a vertical point of view (as shown in the planar view of FIG. 1), the "opening/mouth" of the flowerpot (as defined by the n-well 121) is shown to have a rectangular ring profile, which spans substantially across a planar area occupied by the multi-finger nMOS device. The rectangular ring profile of the lateral enclosure portion (e.g., NW 121) of the depletion inducing structure defines a planar encircled region in which an ESD protection device (such as a multi-finger nMOS) may be housed. Horizontally (as shown in the cross-sectional view of FIG. 2), the side wall of the n-well 121 is arranged in the well region 110 layer, and is in connection with the diffusion regions 130 at the outer-most periphery of the diffusion region array (which are defined as the drain regions (D) of the nMOS device, and are connected to the I/O pad (IO). Cooperatively, the n-well 121 of the depletion inducing structure and the respective drain regions (D) connected thereto substantially divide the well region 110 into a enclosed portion (EN) and an exterior portion (EX).

While the structural profile of the instant exemplary n-well 121 defines a substantially rectangular planar encircled region, the actual implementation of the lateral enclosing portion need not to be limited to the example provided herein. For instance, in some embodiments, the n-well defines a substantially circular encircled region that houses a nMOS device of a circular profile. In practice, the n-well may define other regular or irregular shaped regions to suit specific design requirements of particular applications (e.g., configured to match the planar profile of the nMOS device planted therein). Moreover, while the n-well 121 of the instant example does not reside fully under the diffusion region 130 at the outer-most periphery of the diffusion region array, the actual implementation may include other structural arrangements, so long as a portion of the diffusion regions (particularly the ones at the outer periphery of the array) are arranged at least partially in the planar encircled region defined by the depletion inducing structure and in connection with the n-well 121.

On the other hand, the bottom enclosure portion (e.g., DNW 123) of the depletion inducing structure (the bottom wall of the flowerpot) is arranged in connection with a lower portion of the n-well 121. Particularly, the deep n-wall 123 in the instant example is arranged in the substrate 100 under the n-well 121. Specifically, the deep n-well 123 is arranged to assume a substantially rectangular disk-like profile below the n-well 121, with a periphery portion thereof connected to the bottom portion of the encircling n-well 121 in a substantially sealing manner. While the disk-like profile of the deep n-well 123 is shown to be slightly smaller than the lateral footprint defined by the n-well 121 in the instant figures, the actual implementation of the bottom enclosure portion need not to be limited to the example provided herein, so long as it is configured to substantially match the profile of the planar encircled region defined by the n-well 121 there-above.

The gap 125 in the instant example is arranged in the deep n-well 123 substantially at a geometric central region thereof. Particularly, with the sealing connection between the lower portion of the n-well 121 and the periphery region of the deep n-well 123, the depletion inducing structure substantially encloses a sub-surface boundary in the well region 110. Accordingly, the enclosed portion (EN) of the well region 110 is allowed to establish connection with the substrate 100 substantially through the gap 125 defined in the deep n-well 123.

Analogously, the substrate 100 in the instant exemplary device resembles a drip tray/saucer under a flowerpot. Particularly, the enclosed portion (EN) of the well region 110 may establish connection with the substrate 100 through the drain hole (i.e., the gap 125) in the deep n-well 123, and through the substrate 100 to the exterior portion (EX) of the well region 110. The central arrangement of the gap 125 in the instant example contributes to the establishment of more even conduction paths from each of the fingers of the nMOS device disposed above, which helps to reduce the differences in substrate resistance among different conduction paths, thereby improving the uniform turn-on characteristics of the multiple fingers. However, the specific location for arranging the gap 125 may be chosen in accordance with specific operational needs and/or other design consideration, thus the arrangement of the gap need not be limited to the exemplary illustration provided herein.

A substrate contact region (e.g., a P+ region 150) is provided in the well region 110 outside the planar enclosed region defined by the n-well 121 of the depletion inducing structure. The substrate contact region 150 may be realized in the form of a positive type guard ring 150 disposed in the well region 110 around the ESD protection devices (e.g., the nMOS). Like the source (S) and the gate (G) of the nMOS device for which it horizontally encircled, the substrate contact region 150 is also connected to the ground (VSS).

The semiconductor structure of the instant example is further provided with an isolation structure (e.g., STI 140) laterally encircling an outer periphery of the diffusion regions 130 planted in the planar enclosed profile defined by the depletion inducing structure. Moreover, the isolation structure 140 is arranged between the diffusion regions 130 and the substrate contact region 150, which contributes to isolating the enclosed portion (EN) of the well region 110 from the exterior portion (EX) thereof.

Figure 3:
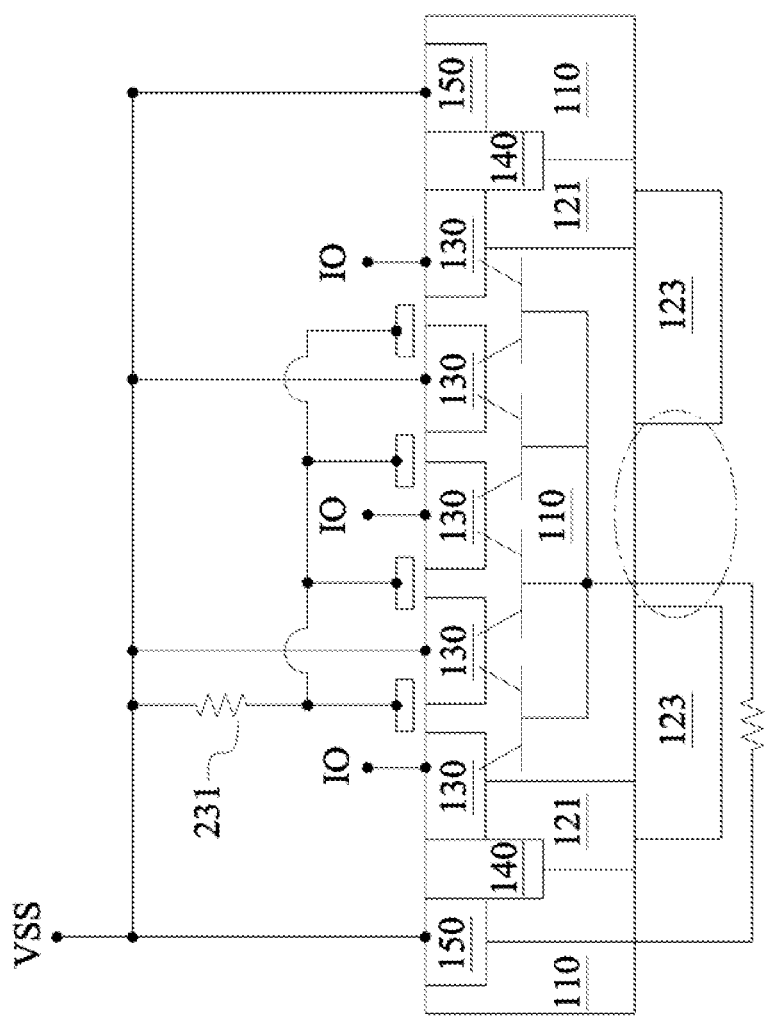
FIG. 3 is a schematic illustration showing a lateral cross-sectional view of a semiconductor structure in accordance with embodiments of the instant disclosure.

Referring to FIG. 3. FIG. 3 is a schematic illustration showing a lateral cross-sectional view of a semiconductor structure in accordance with embodiments of the instant disclosure. Specifically, equivalent circuit diagrams are included in FIG. 3 to aid the explanation of the operation of the exemplary semiconductor structure under normal operation as well as upon an ESD stress situation in the subsequent discussion. To maintain clarity, certain labels are omitted in the instant drawing (e.g., gate (G) and STI 140).

As discussed previously, the alternating source (S) and drain (D) in the planar enclosed region (e.g., the horizontal rectangular profile defined by the n-well 121 of the depletion inducing structure) constitute the fingers of the grounded-gate n-type MOS device. Moreover, the alternating dopant polarities between the diffusion regions 130 and the well region 110 in turn constitute a series of p-n junctions at the finger regions of the MOS device, which intrinsically define a plurality of adjacently arranged parasitic lateral bipolar junction transistors (BJTs). Specifically, the diffusion region 130 connected to the I/O pad (IO) (hence defining a drain of the nMOS) constitutes a collector (C) of the parasitic BJT; the positively doped well region 110 constitutes the body (B) of the parasitic BJT; and the diffusion region 130 connected to the ground (VSS) (hence defining a source of the nMOS) constitutes the emitter (E) of the parasitic BJT. Moreover, the base (B) of each of the lateral parasitic BJTs are connected to the ground (VSS) via the substrate contact region 150 through the substrate 100, as illustrated by the connection path through the gap defined in the deep n-well 123. The connection path through the positively doped substrate and well region inherently provides an equivalent substrate resistance (Rsub). Moreover, the longer the connection path is, the higher the value of the substrate resistance (Rsub) will be.

Figure 4:
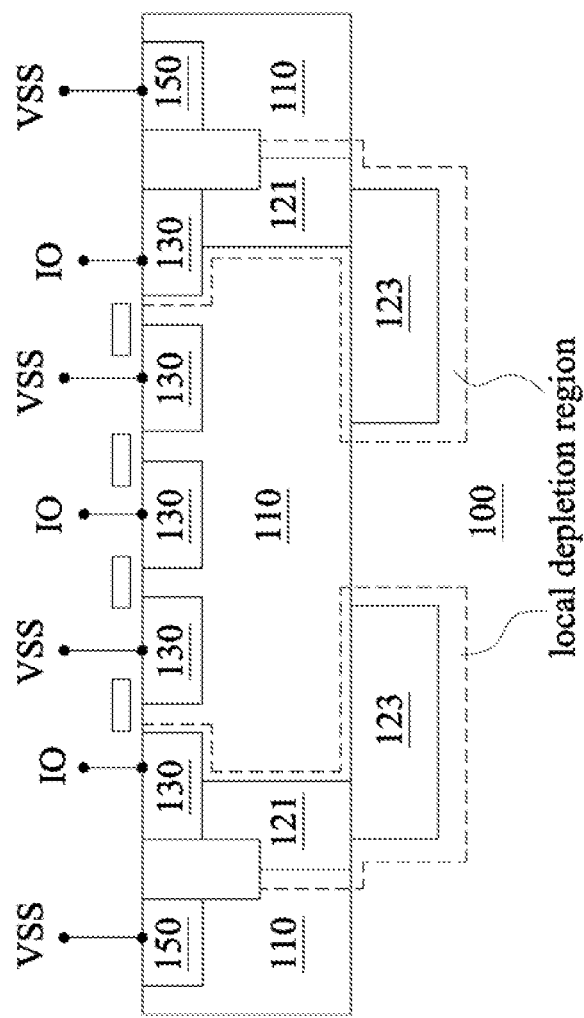
FIG. 4 is a schematic illustration showing a lateral cross-sectional view of a semiconductor structure in accordance with embodiments of the instant disclosure during normal operation.

Referring to FIG. 4. FIG. 4 is a schematic illustration showing a lateral cross-sectional view of a semiconductor structure in accordance with embodiments of the instant disclosure during normal operation mode.

Specifically, the border of different dopant types between the substrate 100/well region 110 and the depletion inducing structure (e.g., 121/123) inherently creates an extended p-n junction there-between. The p-n junction correspondingly generates a locally depleted region around the border region (as illustrated by the dashed lines) in the semiconductor structure, which is substantially depleted of mobile charge carriers. For ESD protection applications, the depletion inducing structure (e.g., 121/123) is configured in such a way that, during normal operation (where no ESD is present), the depletion region generated thereby maintains a relatively small/thin profile, leaving a substantially unobstructed connection path between the well region 110 and the substrate 100 through the "drain hole" in the bottom enclosure portion (e.g., the gap 125 in the DNW). Accordingly, during normal operation, the well region 110 is biased to the ground (VSS) through the substrate 100. Therefore, in the normal operation mode, the ESD protection mechanism in the semiconductor structure is not triggered, thereby ensuring normal operation of a connected internal circuit which it protects.

Figure 5:
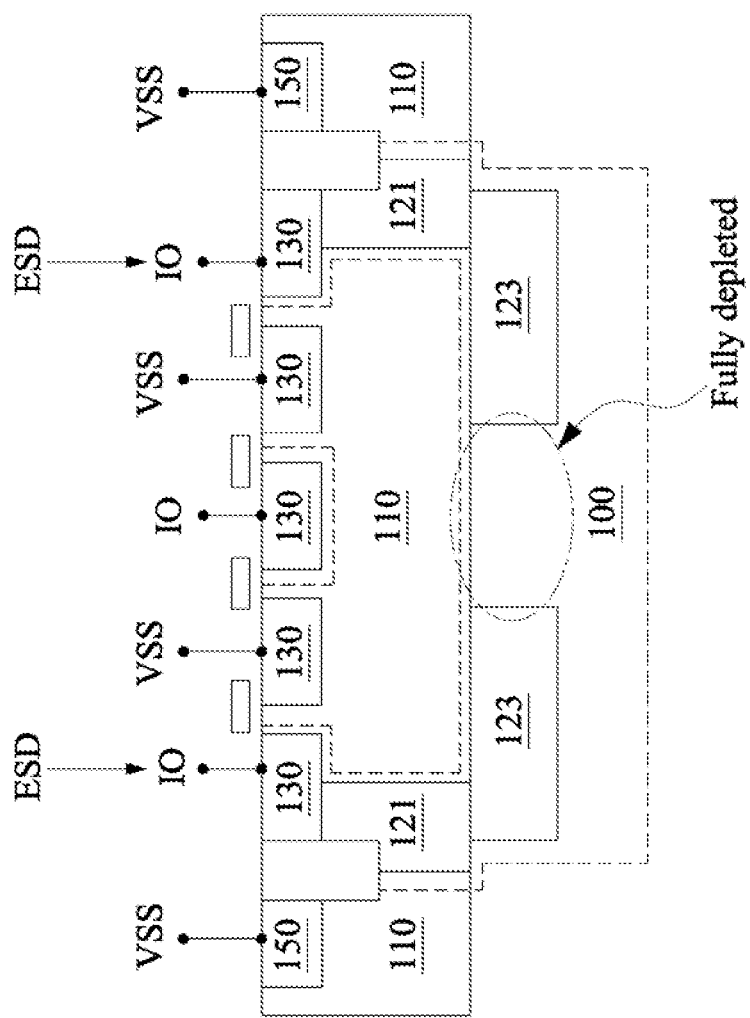
FIG. 5 is a schematic illustration showing a lateral cross-sectional view of a semiconductor structure in accordance with embodiments of the instant disclosure under ESD stress.

FIG. 5 provides a schematic illustration showing a lateral cross-sectional view of a semiconductor structure in accordance with embodiments of the instant disclosure under ESD stress.

Like other conventional nMOS based ESD protection devices, an incoming positive ESD voltage from the I/O pad (IO) would reverse bias the p-n junction between the collector (C) and the base (B) of the parasitic BJT (as shown in FIG. 3). As the strong electric field of the ESD stress rises to a certain level (i.e., a first breakdown voltage, namely, the trigger voltage), the reverse biased collector-base p-n junction will undergo an avalanche breakdown, thereby causing the generation of mobile charge carrier pairs (i.e., electrons and holes pairs). As the electrons from the avalanche breakdown is urged by the positive ESD voltage and thus flow toward the I/O pad, the holes are pushed into the well region 110, which also constitutes the base (B) of the parasitic BJT, causing the increase of base voltage. The increased base voltage in turn forward biases the base-emitter p-n junction of the parasitic BJTs, thereby turning on the parasitic ESD protection mechanism. Upon the activation of the parasitic BJTs, the ESD stress may be released from the emitter (or the source of the nMOS device) to the ground (VSS).

As mentioned above, the I/O pad (I/O) connected to a drain diffusion region 130 of the semiconductor structure is often the point of origin of an ESD strike (the downward pointing arrows toward the IO represent the incoming ESD stress). In addition to the convention lateral parasitic BJT mechanism, in an ESD event, the connection between the drain diffusion regions 130 and the depletion inducing structure of the instant disclosure allows the sudden surge of ESD voltage from an I/O pad (IO) to be directed through the drain region and the n-well 121 to the deep n-well 123. For instance, in the case of a positive ESD voltage, the sudden hike of voltage in the depletion inducing structure would attract and therefore substantially evacuate the majority charge carriers (i.e., electrons) from the n-type depletion inducing structure. Accordingly, the strong electric field of the ESD stress at the bottom portion of the depletion inducing structure therefore momentarily generates an expanded depletion region at the gap region defined in the deep n-well 123.

As a result of the creation of the expanded depletion zone in the deep n-well 123 region between the well region 110 and the substrate 100, the substrate resistance may be drastically increased. Depending on the configuration of the depletion inducing structure (e.g., the profile and the size of the gap in the DNW), a substantially fully depleted region may be achieved in the substrate (or even making the PW floating) upon an ESD stress.

The momentary increase of substrate resistance contributes to the rise of the base voltage in the parasitic BJTs and hence acts as a substrate trigger. As a result, less built up voltage would be required to turn on the parasitic transistors, which dynamically lowers the trigger voltage. In addition, the increased base voltage in the parasitic BJTs may also facilitate a more uniform triggering of the fingers in the nMOS device. Furthermore, the n-well 121 of the depletion inducing structure may act as a reverse diode to release negative ESD current.

Figure 6:
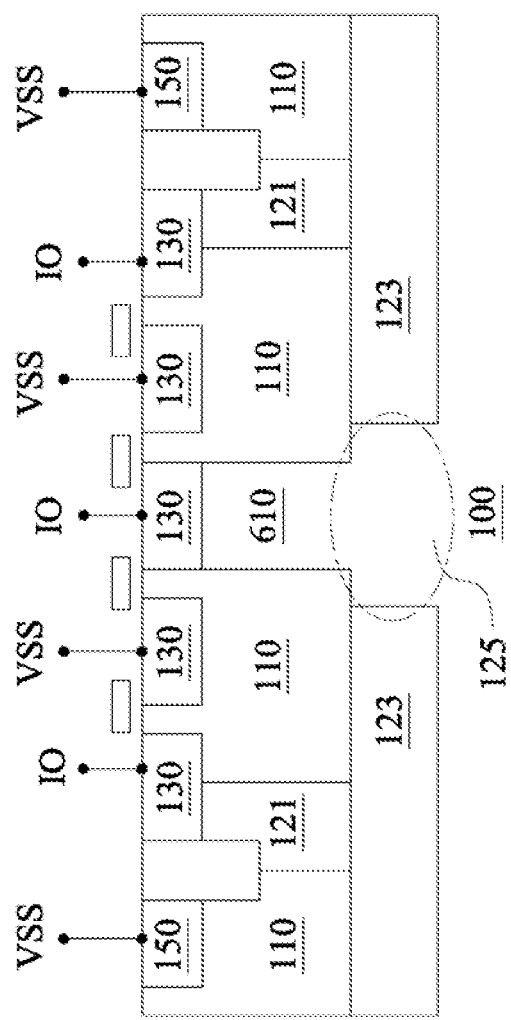
FIG. 6 is a schematic illustration showing a lateral cross-sectional view of a semiconductor structure in accordance with embodiments of the instant disclosure.

FIG. 6 is a schematic illustration showing a lateral cross-sectional view of a semiconductor structure in accordance with some embodiments of the instant disclosure. Specifically, the semiconductor structure of the instant example comprises an overall structural arrangement similar to that of the previous embodiment, with the additional inclusion of a native nMOS blocked implant (NTN) region 610 arranged in the well region 110 above the gap in the bottom enclosure portion (e.g., DNW 123) of the depletion inducing structure. Particularly, the NTN region is in connection with the substrate 100 through the gap defined in the deep n-well 123. Owing to the lower dopant concentration in the NTN region 610, a substantially fully depleted zone may be more easily generated in the substrate upon the occurrence of an ESD event, thereby increasing the efficiency of the dynamic low voltage triggering mechanism.

For the brevity of disclosure, the remaining features shared by the instant example and the previous embodiment will not be repeated.

Figure 7:
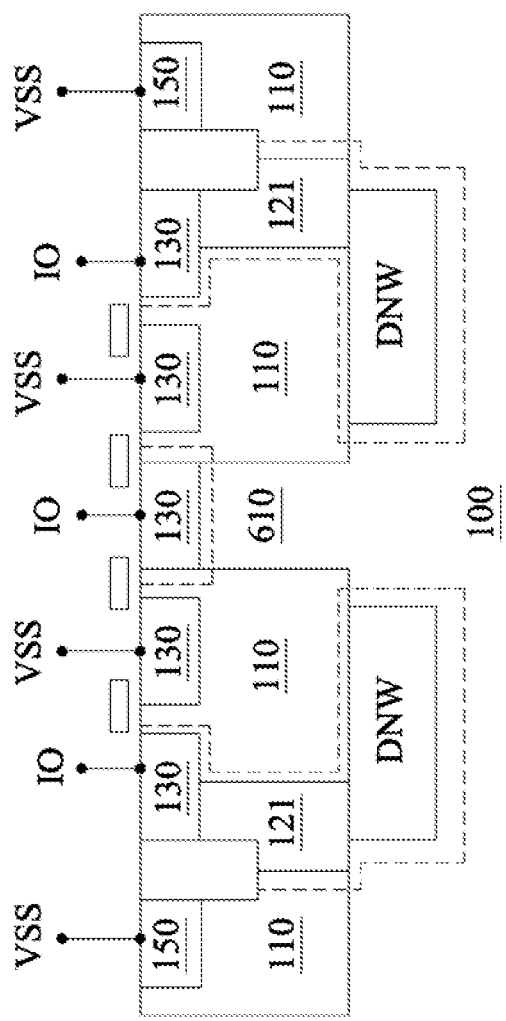
FIG. 7 is a schematic illustration showing a lateral cross-sectional view of a semiconductor structure in accordance with embodiments of the instant disclosure during normal operation.

FIG. 7 is a schematic illustration showing a lateral cross-sectional view of a semiconductor structure in accordance with embodiments of the instant disclosure during normal operation. Similar to the previous embodiment, the border of different dopant types between the substrate 100/well region 110 and the depletion inducing structure (e.g., 121/123) inherently creates an extended p-n junction there-between. The p-n junction correspondingly generates a locally depleted region around the border region (as illustrated by the dashed lines) in the semiconductor structure, which is substantially depleted of mobile charge carriers. During normal operation, the depletion region generated thereby maintains relatively small/thin profile, leaving a substantially unobstructed connection path between the well region 110 and the substrate 100 through the gap 125 in the bottom enclosure portion (e.g., DNW 123). Accordingly, during normal operation, the well region 110 is biased to the ground (VSS) through the substrate 100. Therefore, in the normal operation mode, the ESD protection mechanism resided in the semiconductor structure is not triggered, thus ensuring normal operation of a connected internal circuit which it protects.

Figure 8:
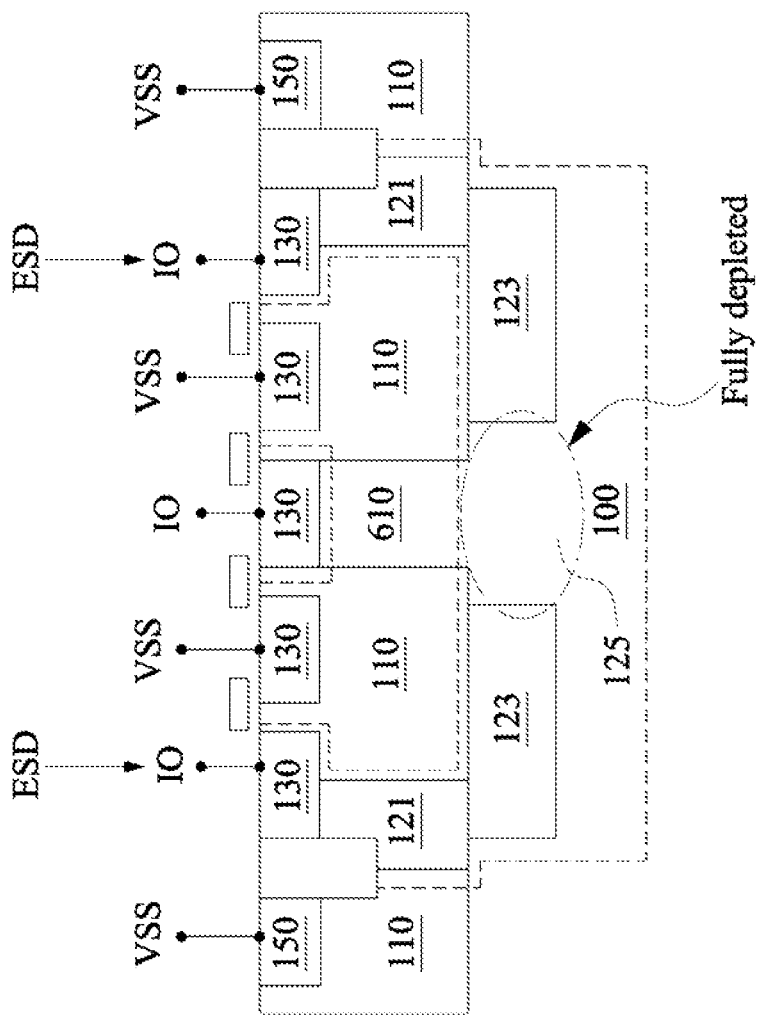
FIG. 8 is a schematic illustration showing a lateral cross-sectional view of a semiconductor structure in accordance with embodiments of the instant disclosure under ESD stress.

Referring to FIG. 8. FIG. 8 is a schematic illustration showing a lateral cross-sectional view of a semiconductor structure in accordance with embodiments of the instant disclosure under ESD stress.

Likewise, upon the occurrence of an ESD stress, the incoming ESD voltage from the I/O pad (IO) would reverse bias the p-n junction between the collector (C) and the base (B) of the parasitic BJT (as shown in FIG. 3) and eventually causes an avalanche breakdown. The breakdown of the collector-base junction at the first breakdown voltage (i.e., the trigger voltage) causes the generation of electrons and holes pairs, which contributes to the increase of base voltage in the parasitic BJTs. The increased base voltage in turn forward biases the base-emitter p-n junction of the parasitic BJTs, thereby turning on the parasitic ESD protection mechanism.

Similarly, the connection between the drain diffusion regions 130 and the depletion inducing structure allows the sudden surge of ESD voltage from an I/O pad (IO) to be directed through the drain region and the n-well 121 to the deep n-well 123. Accordingly, the electric field of the ESD stress at the bottom portion of the depletion inducing structure may momentarily generate an expanded depletion region at the gap region defined in the deep n-well 123. Moreover, because of the lower dopant concentration in the NTN region 610, a substantially fully depleted zone may be more easily generated in the substrate, thereby increasing the responsiveness of the dynamic low voltage triggering mechanism.

As a result of the creation of the expanded depletion zone in the deep n-well 123 region between the well region 110 and the substrate 100, the substrate resistance may be drastically increased. The momentary increase of substrate resistance gives rise to the base voltage in the parasitic BJTs and hence acts as a substrate trigger. Hence, less built up voltage is required to turn on the parasitic transistors, which dynamically lowers the trigger voltage. The increased base voltage in the parasitic BJTs may also facilitate a more uniform triggering of the fingers in the nMOS device.

Figure 9:
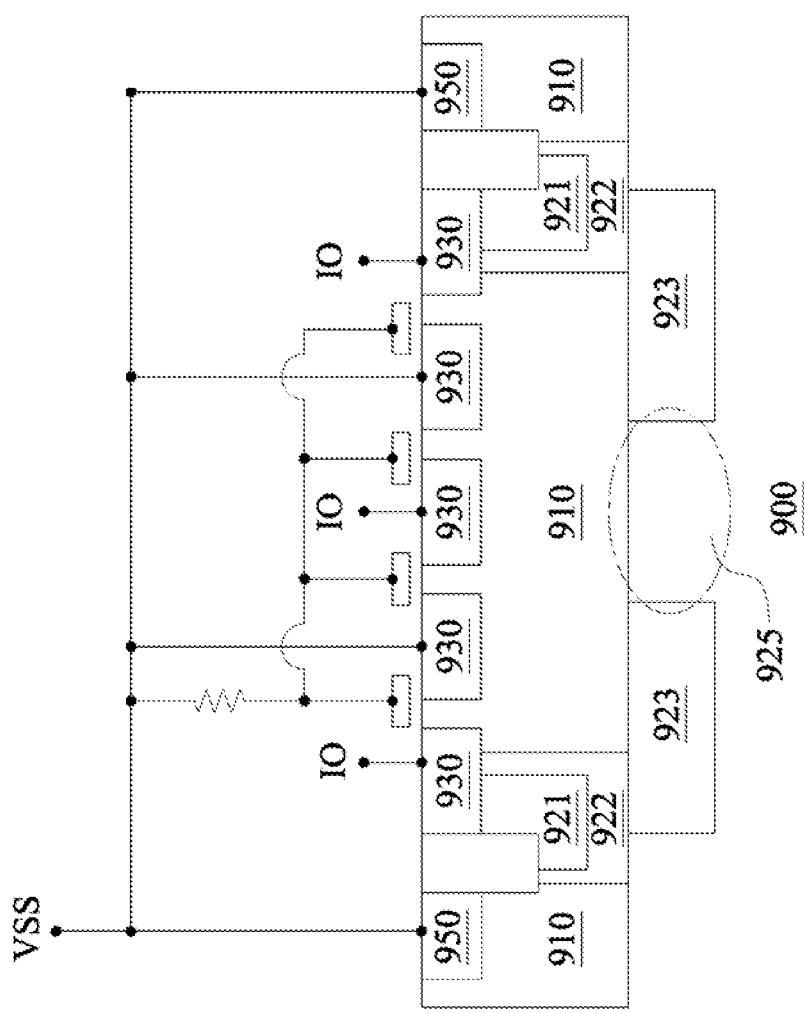
FIG. 9 is a schematic illustration showing a lateral cross-sectional view of a semiconductor structure in accordance with embodiments of the instant disclosure.

Referring to FIG. 9, which provides a schematic illustration showing a lateral cross-sectional view of a semiconductor structure in accordance with some embodiments of the instant disclosure.

Specifically, the semiconductor structure in accordance with the instant embodiment is adapted to an extra high-voltage bipolar-CMOS-DMOS (BCD) process. The overall structural arrangement of the instant embodiment remains similar to that of the previous examples, and therefore will not be repeated for the brevity of disclosure. However, the laterally enclosing portion of the depletion inducing structure in the instant example comprises a shallow n-type well (SHN) structure 921 and a high voltage n-well (HVNW) structure 922, while the bottom enclosure portion of the depletion inducing structure comprises a n-type barrier layer (NBL) 923 instead. Likewise, a gap 925 is defined in the n-type barrier layer 923, through which the well region 910 is connected to the substrate 900.

FIG. 10 is a chart that depicts a method of providing ESD protection to a device (e.g., an active device, such as an NMOS transistor) on a substrate. References are selectively made to elements/features depicted in the previous embodiments to enable better comprehension. At 1010, a substrate of a first dopant type is provided. A well region of the first dopant type is defined at a surface region in the substrate. At 1020, a device (e.g., NMOS transistor) is provided in the well region of the substrate. The device may include a diffusion region (e.g., diffusion region 130) that defines a source/drain thereof, as well as a gate structure (e.g., gate structure G). The device is typically formed in a surface region of the well region, and has a horizontal profile that defines a lateral periphery.

At 1030, a lateral enclosing structure is provided in the well region around the periphery of the device. The lateral enclosing structure may be implemented as an N-well (e.g., N-well 121) that is surroundingly arranged around the periphery of the device.

At 1040, a bottom enclosing structure is provided under the laterally enclosing structure. The bottom enclosing structure may be implemented as a deep N-well (e.g., deep N-well 123) arranged in the substrate under the well region. Moreover, the lateral enclosing structure is provided in connection with the diffusion region of the device. On the other hand, the bottom enclosing structure is provided with a gap defined therein (e.g., gap 125). The lateral and the bottom enclosing structures are arranged in connection with each other in a substantially sealing fashion to form a depletion inducing structure. The structural arrangement of the depletion inducing structure substantially isolates the well region under the device from the surrounding substrate, and allows connection between the enclosed portion (e.g., the enclosed portion (EN)) of the well region and the external portion (e.g., the exterior portion (EX)) of the substrate only through the gap.

At 1050, an isolation structure (e.g., STI 140) may be further provided in the well region to laterally enclose the device. Particularly, the isolation structure may, in cooperation with the laterally enclosing structure, define a laterally enclosed region in the well region (e.g., the region under the device) that laterally separates the device from other portions of the substrate. At 1060, a native nMOS blocked implant (NTN) region may be further provided in the well region above the gap in the bottom enclosure portion of the depletion inducing structure. The addition of the NTN region may further facilitate the generation of a substantially fully depleted zone at the gap region in the case of an ESD event, thereby increasing the responsiveness of the dynamic low voltage triggering mechanism in accordance with the instant disclosure. It is noted that, the chart of FIG. 10 only outlines a method of providing an ESD protection mechanism for a device; the specific implementation of fabrication processes and the order thereof should not be limited to that shown in the exemplary chart, but should depend on the process choice of a specific application.

Owing to the dynamic depletion induction mechanism, the semiconductor structure in accordance with the instant disclosure provides enhanced responsiveness and effectiveness against ESD strikes. Moreover, the dynamic low voltage triggering mechanism in accordance with the instant disclosure enables easier tuning of the triggering and holding voltages of the ESD protection device through the adjustment of the gap width in the depletion inducing structure and the value of the coupled gate resistor. Furthermore, the structural arrangement in accordance with the instant disclosure provides a compact device profile with simple metal routing, which is compatible with generic process layout and poses no impact on the DC breakdown and the channel characteristics of the transistor device.

Accordingly, one aspect of the instant disclosure provides a semiconductor structure that comprises: a substrate of a first dopant type; a well region of a first dopant type disposed in the substrate; and a depletion inducing structure of a second dopant type having a gap defined therein arranged in the well region; wherein the well region is in connection with the substrate through the gap in the depletion inducing structure.

Accordingly, another aspect of the instant disclosure provides a semiconductor device that comprises: a substrate of a first dopant type; a well region of a first dopant type defined in the substrate; a depletion inducing structure of a second dopant type having a gap defined therein arranged in the well region, defining a planer encircled region; and a source region and a drain region of a second dopant type arranged at least partially in the planar encircled region, the drain region being in connection with the depletion inducing structure; wherein the well region is in connection with the substrate through the depletion inducing structure.

Accordingly, one aspect of the instant disclosure provide an electrostatic discharge (ESD) protection device, which comprises: a substrate of a positive dopant type; a p-well defined in the substrate; a depletion inducing structure of a negative dopant type having a gap defined in a bottom portion thereof disposed in the p-well, and a n-channel device disposed in a planar encircled region defined by the depletion inducing structure; wherein the well region is in connection with the substrate through the depletion inducing structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate of a first dopant type;
   a well region of the first dopant type disposed in the substrate; and
   a depletion inducing structure of a second dopant type having a gap defined therein at least partially arranged in the well region;
   wherein the well region is connected to the substrate through the gap in the depletion inducing structure.

2. The structure of claim 1,
   wherein the depletion inducing structure induces an expanded depletion region at the gap-upon an ESD stress.

3. The structure of claim 1,
   wherein a portion of the depletion inducing structure extends into the substrate.

4. The structure of claim 3, wherein the depletion inducing region comprises
   a laterally enclosing portion defining a planar encircled region; and
   a bottom enclosure portion arranged in the substrate below the laterally enclosing portion.

5. The structure of claim 4,
   wherein the gap is arranged in the portion of the depletion inducing structure that extends into the substrate.

6. The structure of claim 4,
   wherein the well region comprises at least a pair of diffusion regions of a second dopant type arranged at least partially in the planar encircled region defined by the lateral enclosing portion.

7. The structure of claim 6, wherein the depletion inducing structure is in connection with a portion of the diffusion regions.

8. The structure of claim 4, further comprising an isolation structure laterally encircling an outer periphery of the diffusion regions.

9. The structure of claim 4, further comprising a substrate contact region of a first dopant type arranged outside the planar encircled region.

10. The structure of claim 4, further comprising a native nMOS blocked implant region arranged in the well region above the gap in the bottom enclosure portion of the depletion inducing structure.

11. The structure of claim 1, wherein the first dopant type is a positive type dopant, wherein the second dopant type is a negative dopant type.

12. A semiconductor device, comprising:
a substrate of a first dopant type;
a well region of the first dopant type defined in the substrate;
a depletion inducing structure of a second dopant type having a gap defined therein arranged in the well region, defining a planer encircled region; and
a source region and a drain region of a second dopant type arranged at least partially in the planar encircled region, the drain region being in connection with the depletion inducing structure;
wherein the well region is in connection with the substrate through the depletion inducing structure.

13. The device of claim 12,
wherein the depletion inducing structure induces an expanded depletion region in the substrate under the well region upon an ESD stress.

14. The de ice of claim 13,
further comprising a gate structure arranged on the well region between the source and the drain regions.

15. The device of claim 14,
wherein the source region and the gate structure are connected to a ground, and
wherein the drain region is connected to an I/O pad.

16. The device of claim 15,
further comprising a gate resistor connected between the gate structure and the ground.

17. The device of claim 12,
wherein a portion of the depletion inducing structure extends into the substrate.

18. The device of claim 17,
wherein the gap is arranged in the portion of the depletion inducing structure that extends into the substrate.

19. The device of claim 18,
further comprising a substrate contact region arranged outside the planar encircled region connected to the ground.

20. A method of electrostatic discharge (ESD) protection for a device disposed in a well region of a substrate, comprising:
providing a laterally enclosing structure in the well region around a periphery of the device;
providing a bottom enclosing structure having a gap defined therein under the laterally enclosing structure and substantially sealingly connected thereto, such that the well region is connected to the substrate through the gap in the bottom enclosing structure,
wherein the laterally enclosing structure and the bottom enclosing structure cooperatively form a depletion inducing structure that induces an expanded depletion region at the gap upon an ESD stress.

21. The method of claim 20, wherein the well region and the substrate are provided with a first dopant type, and the laterally enclosing structure and the bottom enclosing structure are provided with a second dopant type.

22. The method of claim 20, wherein the lateral enclosing structure is provided in connection with a diffusion region of the device.

23. The method of claim 20, wherein the bottom enclosing structure is provided under the well region in the substrate.

24. The method of claim 20, further comprising:
providing an isolation structure in the well region laterally encircling the device,
wherein, the isolation structure and the laterally enclosing structure cooperatively define a laterally enclosed region in the well region.

25. The method of claim 20, further comprising:
providing a native nMOS blocked implant region in the well region above the gap in the bottom enclosure portion of the depletion inducing structure.

* * * * *